United States Patent
Dickey et al.

(10) Patent No.: US 10,587,295 B1
(45) Date of Patent: Mar. 10, 2020

(54) WIRELESS RECEIVER WITH AUTOMATIC GAIN CONTROL OPTIMIZATION FOR SENSITIVITY AND DISTORTION

(71) Applicant: SILICON LABORATORIES INC., Austin, TX (US)

(72) Inventors: Terry Lee Dickey, Pflugerville, TX (US); Yan Zhou, Spicewood, TX (US); Praveen Vangala, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/217,494

(22) Filed: Dec. 12, 2018

(51) Int. Cl.
H04B 1/00 (2006.01)
H04B 7/00 (2006.01)
H04B 17/00 (2015.01)
H04B 1/10 (2006.01)

(52) U.S. Cl.
CPC .................................. *H04B 1/109* (2013.01)

(58) Field of Classification Search
CPC ..... H04W 84/12; H04W 88/06; H04W 88/08; H04B 1/04; H04B 1/16; H04B 1/1027; H04B 7/08; H04B 17/318; H04B 17/336
USPC ........... 455/63.1, 67.13, 226.1, 226.2, 226.3, 455/232.1, 234.1, 295, 296, 333
See application file for complete search history.

(56) References Cited

U.S. PATENT DOCUMENTS

| | | | | |
|---|---|---|---|---|
| 7,664,211 | B2* | 2/2010 | Solum | H03G 3/3052 455/234.1 |
| 8,406,274 | B1* | 3/2013 | Hirsch | H03G 3/3078 375/133 |
| 8,818,313 | B2* | 8/2014 | Qin | H04W 52/04 455/232.1 |
| 9,160,171 | B2* | 10/2015 | Patterson | H02J 3/38 |
| 10,009,779 | B2* | 6/2018 | Zhu | H04L 5/0057 |
| 10,084,515 | B2* | 9/2018 | Ferrante | H04W 72/0406 |

OTHER PUBLICATIONS

AN1017: Zigbee® and Thread Coexistence with Wi-Fi. Rev 1.4|1. Silicon Labs, 400 West Cesar Chavez, Austin, TX 78701. pp. 1-42. Sep. 12, 2018.

* cited by examiner

*Primary Examiner* — Quochien B Vuong
(74) *Attorney, Agent, or Firm* — Gary Stanford; Huffman Law Group, PC

(57) ABSTRACT

A wireless receiver including multiple amplifiers coupled in series for amplifying a signal being received, at least one detector that provides a strength indication of the signal being received, multiple AGC schedules each determining a gain reduction schedule for the amplifiers, an AGC schedule selector that selects one of the AGC schedules based on a schedule select input, and an AGC controller that adjusts a gain of at least one of the amplifiers according to a selected AGC schedule based on the strength indication of the signal being received. The AGC schedules may include a first AGC schedule configured for improved SNR performance and a second AGC schedule configured for improved distortion performance. The second AGC schedule may be selected for improved distortion performance when a strong distorting blocker signal is present, and otherwise the first AGC schedule may be selected for better SNR performance.

19 Claims, 4 Drawing Sheets

WIRELESS RECEIVER WITH AUTOMATIC GAIN CONTROL OPTIMIZATION FOR SENSITIVITY AND DISTORTION

BACKGROUND OF THE INVENTION

Field of the Invention

The present invention relates in general to wireless communications, and more particularly to a wireless receiver that adjusts automatic gain control to optimize either signal-to-noise ratio (SNR) or distortion (DIS) performance.

Description of the Related Art

A home automation system may be used to control devices and functions in a home or the like, such as lighting, HVAC (climate control), entertainment systems, appliances, home security devices (including access control and alarm systems and the like), etc. The Internet of Things (IoT) is a network of physical devices, home appliances, and other items embedded with electronics, software, sensors, actuators, etc., which enables the devices to interface each other and to exchange information. IoT involves extending Internet connectivity beyond standard devices, such as desktops, laptops, smartphones, tablets, etc., to include additional devices such as home automation devices. In this manner, home automation devices can communicate and interact over the Internet, and they can be remotely monitored and controlled.

Various wireless technologies may be used to implemented a home automation system, such as ZigBee, Thread, Z-wave, etc. ZigBee is a standard for wireless technology that operates according to the IEEE 802.15.4 specification and is used to create networks that require a low data transfer rate, energy efficiency and secure networking. A Zigbee network may have one coordinator, which can discover and permit nodes to join the network. The coordinator and router maintain mesh network route records in order to know how to push messages from one node address to another. End-nodes associate with a parent node (router or coordinator) and sleepy end-nodes wake-up periodically to poll their parent for any queued up messages. Zigbee devices are allowed to send messages to any other node on the mesh network (e.g., light switch telling a particular light to turn on/off). However, in practice, most messages are sent to and from the coordinator. The coordinator maintains the state of the network and is programmed with rules on how the devices are associated.

A gateway may be used to remotely control and monitor the home automation and security setup via a personal computer (PC) or a smartphone application or the like. As such, the gateway may include a pairing of the Zigbee coordinator (occasionally a router if another device already has the coordinator role) to a PC or smartphone via another communication path, both controlled from a gateway host. Although the host may directly present a webpage to allow remote control, a more flexible configuration is to enable the host and the PC/smartphone to communicate with a remote cloud server. Thus, the gateway typically contains Internet access which may be implemented in various ways, such as an integrated modem (e.g., DOCSIS), Ethernet connection from one or more gateways to a main router, or a Wi-Fi connection to the main router. A command on the PC/smartphone goes to the cloud, the cloud forwards message to the modem/router/gateway host, which then issues command to the network via the integrated Zigbee coordinator.

A popular trend is to integrate the modem, Ethernet/Wi-Fi router, and gateway functionality into a single wireless communication device, in which the Wi-Fi is usually a Wi-Fi Access Point (AP). Thus, it is becoming more common to integrate a home automation communication device, such as based on Zigbee or the like, with a Wi-Fi communication device into a single gateway device. Such an integrated solution, however, may suffer from various communication issues when the different wireless technologies communicate within the same frequency range. Zigbee and Wi-Fi, for example, may communicate within overlapping frequency ranges. Zigbee incoming messages, such as communications from alarms, sensors, actuators, etc., are asynchronous. If a Wi-Fi transmission is active during an incoming Zigbee message, the Wi-Fi signal operates as a signal blocker that interferes with Zigbee transmissions so that the Zigbee message may be lost. A signal "blocker" is a coincident signal at or near the frequency of the signal of interest being received causing various potential impairments to the desired signal, such as distortion, compression, de-sensitization, etc. A strong Wi-Fi signal presents a strong distorting blocker that interferes with a wireless Zigbee signal.

SUMMARY OF THE INVENTION

A wireless receiver according to one embodiment includes multiple amplifiers coupled in series for amplifying a signal being received, at least one detector that provides a strength indication of the signal being received, multiple automatic gain control (AGC) schedules, each determining a gain reduction schedule for the amplifiers, an AGC schedule selector that selects one of the AGC schedules based on a schedule select input, and an AGC controller that adjusts a gain of at least one of the amplifiers according to a selected one of AGC schedules based on the strength indication of the signal being received.

The AGC schedules may include a first AGC schedule configured for improved signal-to-noise ratio (SNR) performance and a second AGC schedule configured for improved distortion performance. The schedule select input may select the second AGC schedule for improved distortion performance when a strong distorting blocker signal is detected or otherwise expected, and may otherwise select the first AGC schedule for better SNR performance. The AGC schedule selector may be configured to prevent a change of AGC schedule selection while a receive detect signal indicates that a wireless signal is being received.

In one embodiment, the amplifiers may include an input attenuator, a low noise amplifier, and a programmable gain amplifier. The first AGC schedule reduces gain in the order of a first input of the low noise amplifier, then the programmable gain amplifier, then the attenuator, and then a second input of the low noise amplifier. The second AGC schedule reduces gain in the order of the first input of the low noise amplifier, then the attenuator, then the programmable gain amplifier, and then the second input of the low noise amplifier.

The AGC schedule selector may be implemented on an integrated circuit having an input pin, and the schedule select input may be hardwired to the input pin for automatic AGC selection. In an alternative configuration, the integrated circuit may further include a processing circuit including an interrupt circuit coupled to the input pin that causes the processing circuit to control the schedule select input based on a signal received via the input pin. In yet another configuration, a communication interface may be implemented on the integrated circuit for interfacing external devices, and a processing circuit may also be implemented on the integrated circuit and coupled to the communication interface and the schedule select input of the AGC schedule selector. In this case, the processing circuit controls selection from among the AGC schedules based on a mode command received via the communication interface.

A wireless communication system according to one embodiment includes a first wireless transceiver and a second wireless transceiver that are co-located in the same device, in which the second wireless transceiver is capable of generating a strong blocker signal when transmitting, and in which the first wireless transceiver includes multiple AGC schedules including a first AGC schedule configured for improved signal-to-noise ratio performance and a second AGC schedule configured for improved distortion performance, an AGC schedule selector that selects an AGC schedule based on a blocker indication specifying when the second wireless transceiver is transmitting, and an AGC controller that adjusts a gain of the first wireless transceiver according to a selected AGC schedule while receiving a signal.

The AGC schedule selector may select the second AGC schedule when the blocker indication indicates that the second wireless transceiver is transmitting, and otherwise selects the first AGC schedule. The first wireless transceiver may be configured according to a Zigbee protocol and the second wireless transceiver may be configured according to a Wi-Fi protocol. The AGC schedule selector may be configured to prevent changing the AGC schedule while a receive active signal indicates that the first wireless transceiver is actively receiving a signal.

The second wireless transceiver may assert a power amplifier enable signal to indicated when transmitting, and the first wireless transceiver may include a controller having an input port receiving the power amplifier enable signal as the blocker indication. In one configuration, the input port is hardwired to a select input of the AGC schedule selector for selecting from among the AGC schedules. In another embodiment, the controller of the first wireless transceiver includes an interrupt controller coupled to the input port and configured to generate an interrupt when the power amplifier enable signal changes state, and a processing circuit that detects the interrupt and that provides the blocker indication to a select input of the AGC schedule selector for selecting an AGC schedule. In yet another embodiment, the first wireless transceiver may include a controller which further includes a communication interface and a processing circuit that generates the blocker indication based on a mode command received via the communication interface.

A method of automatic gain control of a wireless receiver according to one embodiment includes providing multiple AGC schedules available to the wireless receiver including a first AGC schedule configured for improved signal-to-noise ratio performance and a second AGC schedule configured for improved distortion performance, receiving an AGC schedule selection indication from an external device, selecting, based on the AGC schedule selection indication, one of the AGC schedules, and adjusting gain while receiving a wireless signal according to a selected AGC schedule.

The method may include receiving a transmit indication from a co-located device when transmitting a blocking signal, and selecting the second AGC schedule while the transmit indication is provided. The method may include receiving a selection command via a communication interface, and selecting an AGC schedule based on the selection command.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to resolve conflicts between co-located wireless communication devices of a wireless communication system. They have therefore developed a wireless receiver with an automatic gain control (AGC) optimization that provides a tradeoff between sensitivity and distortion performance. The wireless receiver may include an AGC schedule that is configured for the best signal-to-noise (SNR) performance, which is optimal when there are weak or no distorting blocker signals. The wireless receiver also includes an AGC schedule that is configured for improved distortion performance when in the presence of a strong distorting blocker signal. The wireless receiver is configured to switch between the different AGC schedules based on the applicable communication mode. The SNR-optimized AGC schedule may be selected as the default AGC schedule when only a weak blocker signal is detected or otherwise expected. The distortion-optimized schedule may be selected when a strong distorting blocker signal is detected or otherwise expected.

Figure 1:
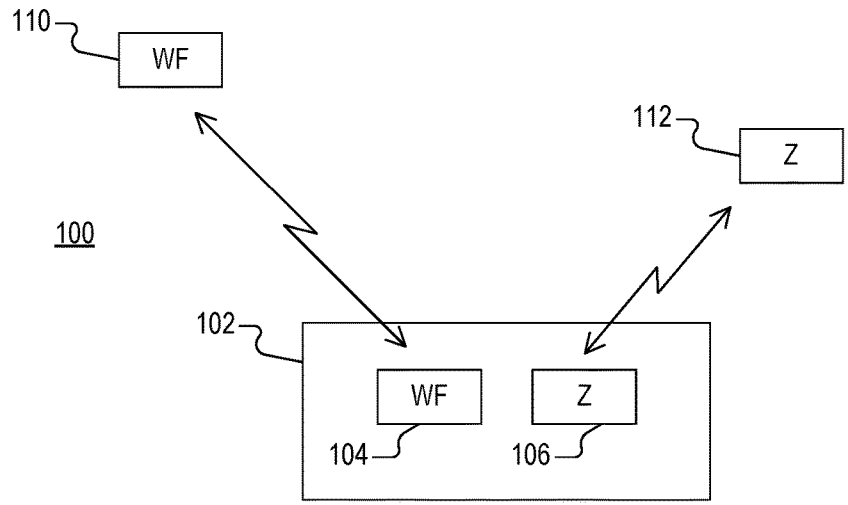
FIG. 1 is a simplified illustration of a local network including a gateway with co-located wireless devices.

FIG. 1 is a simplified illustration of a local network 100 including a gateway 102 with co-located wireless devices. In the illustrated configuration, the gateway 102 is a wireless communication system that incorporates a Wi-Fi (WF) wireless transceiver 104 co-located with a Zigbee (Z) wireless transceiver 106. The WF wireless transceiver 104 wirelessly communicates with other local or near-by WF devices in the local network 100, such as, for example, another WF wireless device 110 as shown. In a similar manner, the Z wireless transceiver 106 wirelessly communicates with other local or near-by Z devices in the local network 100, such as another Z wireless device 112. The WF wireless device 110 may establish or at least be part of a local area network (LAN) or the like for enabling communication between multiple Wi-Fi equipped devices, such as smartphones, computers, printers, etc.

Although not shown in FIG. 1, the gateway 102 may incorporate Internet access, such as an integrated modem or Ethernet connection from one or more gateways to a main router, or a Wi-Fi connection to the main router. The WF wireless device 110 may be an access point (AP) or a wireless router or the like. The Z wireless transceiver 106 may serve as a Zigbee coordinator or the like of a home automation system within the wireless network 100. A home automation system may be used, for example, to control devices and functions in a home or the like, such as lighting, HVAC (climate control), entertainment systems, appliances, home security devices, etc. The home automation system may further be part of an IoT network or the like.

In one embodiment, the WF wireless transceiver 104 may be implemented according to any one of the various IEEE 802.11 standards, such as 802.11a, 802.11b, 802.11g, 802.11n, etc. IEEE 802.11n, for example, may operate using 20 Megahertz (MHz) bandwidth channels and 52 orthogonal frequency-division multiplexing (OFDM) subcarrier modulation. The Z wireless transceiver 106 may operate according to the IEEE 802.15.4 standard. Wi-Fi (IEEE 802.11b/g/n) supports up to 14 overlapping 20/22 MHz bandwidth channels across the 2.4 Gigahertz (GHz) ISM band with transmit power levels up to +30 dBm (decibel-milliwatts). 2.4 GHz Zigbee and other protocols (e.g., Thread), which are based on IEEE 802.15.4, support 16 non-overlapping 2 MHz bandwidth channels at 5 MHz spacing with transmit powers up to +20 dBm. Different devices using these wireless protocols may successfully operate in close proximity, such as within the local network 100, although some communication conflicts may occur.

When co-located within the same device however, such as the gateway 102, transmission by the WF wireless transceiver 104 may impede the ability of the Z wireless transceiver 106 to receive communications from other Z wireless devices including the Z wireless device 112. In particular, when the Z wireless transceiver 106 is configured to optimize signal-to-noise ratio (SNR) of signals being received, the strong Wi-Fi transmission by the WF wireless transceiver 104 presents a strong distorting blocker signal that may prevent successful reception of Z signals by the Z wireless transceiver 106. As further described herein, the Z wireless transceiver 106 may be reconfigured during transmissions by the WF wireless transceiver 104 to improve distortion performance to alleviate this issue.

Although the present disclosure describes this communication issue in the context of communication conflicts between Wi-Fi and Zigbee, the novel solution as described herein is applicable to conflicts between other wireless protocols. For example, a similar communication conflict may arise between a first device using the Long-Term Evolution (LTE) wireless protocol co-located with a second device using the Z-wave wireless protocol (e.g., a transmission from the LTE device may interfere with the ability of the Z-wave device to receive Z-wave communications).

Figure 2:
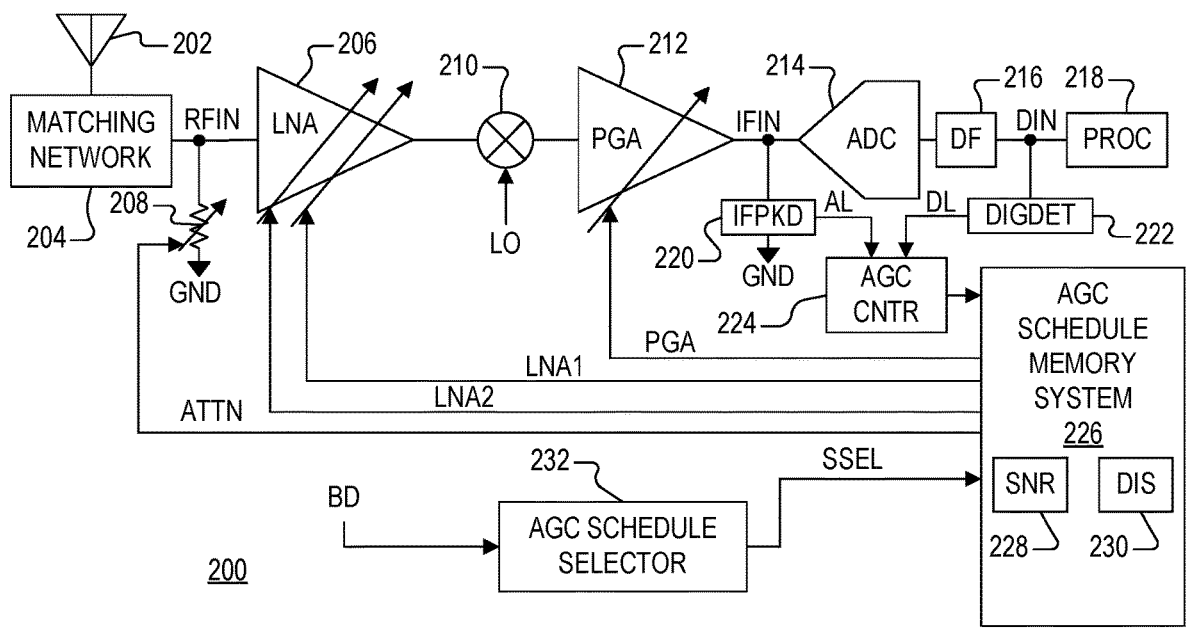
FIG. 2 is a simplified block diagram of a Zigbee receiver according to one embodiment that may be used by or otherwise incorporated within the Z wireless transceiver of FIG. 1.

FIG. 2 is a simplified block diagram of a Zigbee receiver 200 according to one embodiment that may be used by or otherwise incorporated within the Z wireless transceiver 106. An antenna 202 is coupled to a matching network 204, which provides a received radio frequency (RF) input signal (RFIN) to the input of a low-noise amplifier (LNA) 206. The matching network 204 enables tuning of the antenna 202 to reduce reflected energy and noise. An attenuator 208 is coupled to the input receive path developing RFIN and also coupled to supply reference node, such as ground (GND), in which the attenuator 208 is otherwise known as a passive gain network. The LNA 206 has an output coupled to one input of a mixer 210, which has another input receiving a local oscillator (LO) signal and which has an output providing an intermediate frequency (IF) signal to an input of a programmable gain amplifier (PGA) 212. The PGA 212 has an output providing an IF input (IFIN) signal to an input of an analog-to-digital converter (ADC) 214, having an output providing a digital signal to an input of a digital filter (DF) 216. The DF 216 provides a filtered digital input (DIN) signal to digital processing circuitry 218 for processing the signal being received.

A peak detector 220 detects the strength of the IFIN signal and develops an analog level (AL) value indicative of the relative strength of the signal being received. A digital detector 222 determines from the DIN signal the power level or relative strength of the in-band signal contained within the received RF signal, and provides a corresponding digital level (DL) value. The digital detector 222 may be implemented in any suitable manner, such as received signal strength indication (RSSI) circuit or the like. The AL and DL values are provided to respective inputs of an AGC controller 224, which accesses an AGC schedule memory system 226 to adjust the gains of the various gain devices of the Zigbee receiver 200 according to a selected one of multiple AGC schedules as further described herein. As shown, the AGC schedule memory system 226 provides multiple gain adjust values to adjust receiver gain, including a value ATTN to adjust the gain level of the attenuator 208, a first value LNA1 to adjust a first gain of the LNA 206, a second value LNA2 to adjust a second gain of the LNA 206, and a value PGA to adjust gain of the PGA 212. The AGC schedule memory system 226 stores multiple AGC schedules or back off tables, including, for example, an SNR schedule 228 and a distortion (DIS) schedule 230. An AGC schedule selector 232 asserts a schedule select signal SSEL to select one of the AGC schedules based on a blocker detect (BD) signal as further described herein.

It is noted that the LNA 206 may be considered two separate low-noise amplifiers LNA1 and LNA2. Alternatively, the LNA 206 may be considered as one LNA with two gain inputs, including a first gain input LNA1 for adjusting resistive regeneration and a second gain input LNA2 for adjusting a number of gain cells of the LNA.

In one embodiment, the BD signal is negated low for selecting the SNR schedule 228 (e.g., as the default AGC schedule) and is asserted high for selecting the DIS schedule 230. Although only two different AGC schedules are shown, additional AGC schedules may be defined and included. The BD signal may be considered as a schedule select signal and may include additional bits for selecting from among any number of AGC schedules.

Figure 3:
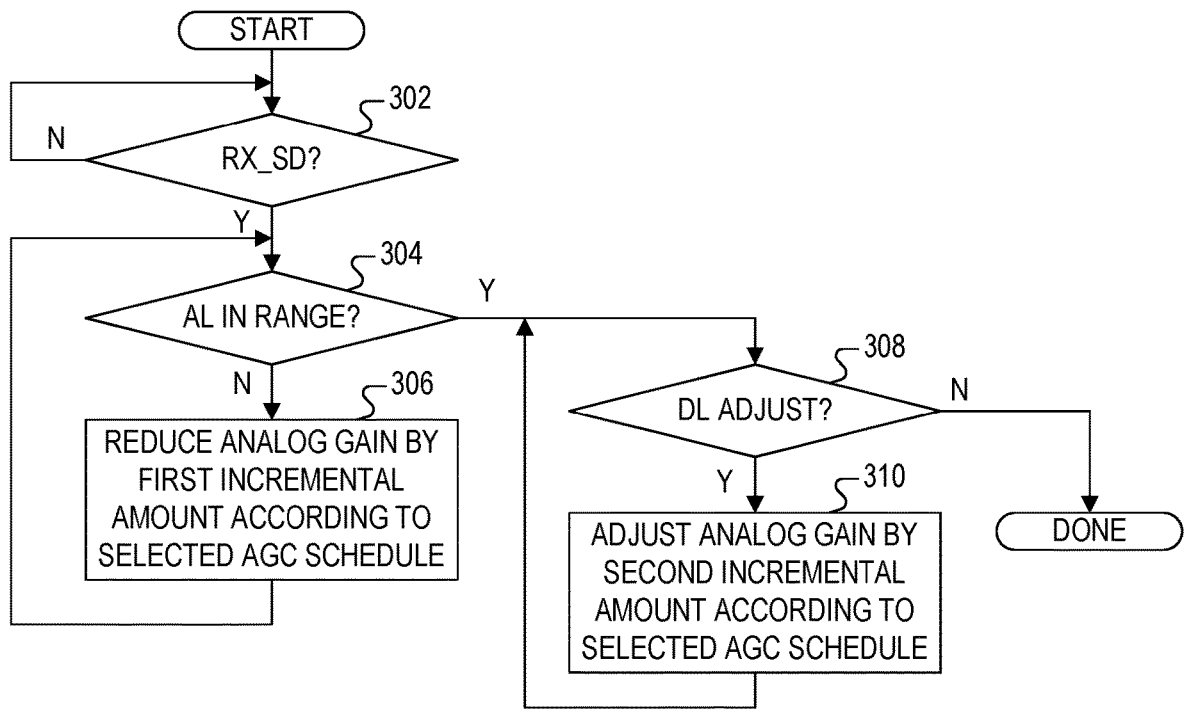
FIG. 3 is a flowchart diagram illustrating operation of the Zigbee receiver of FIG. 2 performing automatic gain control at the onset of a wireless signal being received.

FIG. 3 is a flowchart diagram illustrating operation of the Zigbee receiver 200 performing automatic gain control at the onset of a wireless signal being received according to one embodiment. At a first block 302, the Zigbee receiver 200 monitors a receive detect signal RX_SD indicating whether a wireless signal within the operating frequency range of the Zigbee receiver 200 is detected. The AGC controller 224 initially sets the gain of each of the gain blocks of the receiver circuit at the highest gain level to ensure detection of weak signals. The peak detector 220 may be used for providing the RX_SD signal, such as when the AL value changes by more than a threshold amount indicating that a wireless signal has been detected. Alternative methods of developing the RX_SD signal are known and contemplated. Operation loops at block 302 until RX_SD indicates that a wireless signal is detected.

When RX_SD indicates that a wireless signal is detected, operation advances to block 304 in which it is queried whether the AL value is within a predetermined target range suitable for the ADC 214. Since the gain is initially set at the highest level, a signal with any significant strength may saturate the peak detector 220 so that AL is above the target range. If so, operation advances to block 306 in which the AGC controller 224 reduces the analog gain, meaning adjustment of one or more of the LNA1, LNA2, ATTN, and PGA values by a total of a first incremental amount according to a selected AGC schedule. In one embodiment, only one of the gain values is adjusted at a time, although it is understood that more than one of the gain values may be adjusted for any given iteration. The first incremental amount may be a fixed or programmable value depending upon the particular implementation. In one embodiment, for example, a full gain range may be 50 to 60 decibels (dB) and the first incremental amount may be 6 dB for each incremental step. After adjustment at block 306, operation loops back to block 304 to again query AL. Operation loops between blocks 304 and 306 until the AL value from the peak detector 220 is within the target range. It is noted that if the AL value is within or even less than the target range in the first iteration such as when receiving a weak signal, then block 306 may be skipped and operation may proceed directly to block 308.

When the AL value from the peak detector 220 is within the target range, operation advances to block 308 in which the DL signal is evaluated to determine whether additional gain adjustment is necessary or desired. If so, operation advances to block 310 in which one or more of the gain values LNA1, LNA2, ATTN, and PGA may further be adjusted by a total of a second incremental amount according to the selected AGC schedule. After adjustment, operation loops back to block 308 to determine whether additional gain adjustment is performed, and operation may loop between blocks 308 and 310 until no more gain adjustments are made, at which time operation is completed. In one embodiment, only one of the gain values is adjusted at a time, and the first incremental amount may also be a fixed or programmable value depending upon the particular implementation. In one embodiment, the second incremental amount may be less than the first incremental amount. For example, the second incremental amount may be only 1 or 2 dB for each incremental step.

It is noted that the second loop between blocks 308 and 310 evaluating the DL value is slower than the first loop between blocks 304 and 306 evaluating the AL value since the signal is processed through the ADC 214 and the DF 216 and evaluated by the digital processing circuitry 218 before making further adjustment, and each adjustment, if any, may be significantly smaller. It is further noted that in one embodiment, further incremental adjustments made in the second loop between blocks 308 and 310 based on DL may be limited to reductions in gain rather than increases in gain. An increase of gain at block 310 may cause saturation of the receiver front end during the receive process.

Figure 4:
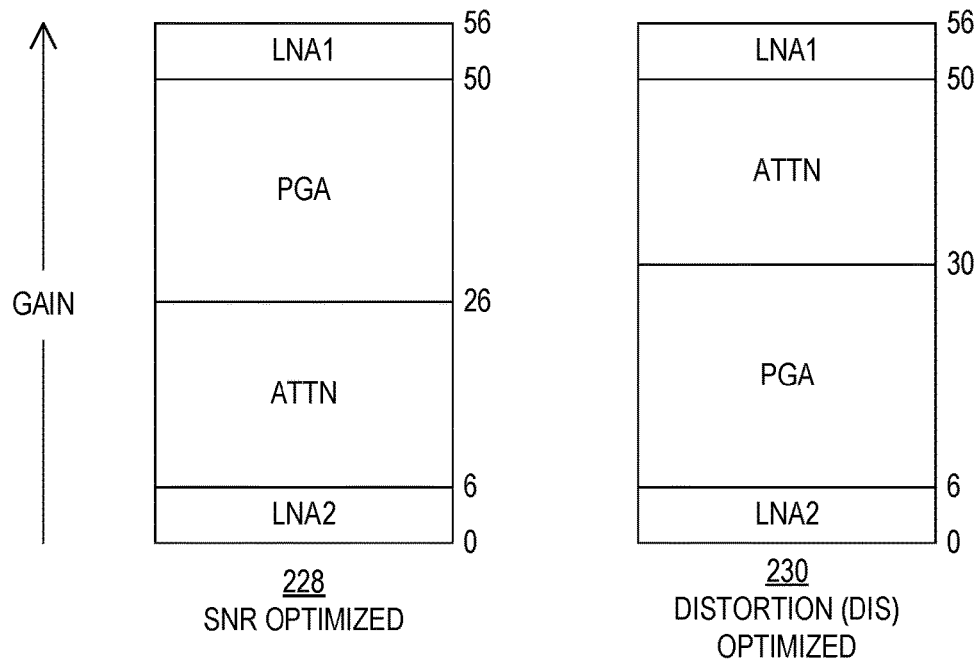
FIG. 4 is a simplified block diagram of the SNR schedule and the DIS schedule of FIG. 2 according to one embodiment.

FIG. 4 is a simplified block diagram of the SNR schedule 228 and the DIS schedule 230 according to one embodiment. The SNR schedule 228 may be the default AGC schedule and is configured to optimize SNR performance, which is appropriate for most cases since the majority of devices are end-node devices. Such end-node devices and the like may only detect weak, or no, distorting blockers (e.g., Wi-Fi 802.11n with 20 MHz bandwidth has 52 OFDM subcarriers which can create IMD3 distortion products (intermodulation distortion from third order) and modulated gain compression). The DIS schedule 230 is optimized for the best distortion performance, such as in the presence of a strong distorting blocker signal. In the illustrated embodiment, the primary source of a strong distorting blocker signal is the Wi-Fi signal generated by the co-located WF wireless transceiver 104.

The gain range for both the SNR schedule 228 and the DIS schedule 230 extends from a minimum gain to a maximum gain. In the illustrated embodiment, the minimum gain is 0 dB and the maximum gain is 56 dB, although different gain values and gain ranges may be defined or used in different configurations. In the illustrated embodiment, the LNA 206 has a total gain of 12 dB, which is divided into a first gain LNA1 of 6 dB and a second gain LNA2 of 6 dB. In addition, the PGA 212 has a total gain of 24 dB and the attenuator 208 has as total gain of 20 dB. It is understood that these gain values and gain ranges are arbitrary and may be different for different embodiments.

As previously noted, the gain values are initially set to their maximum values in order to detect weak signals. Upon detection of a wireless signal (such as via the RX_SD signal) in which gain is to be reduced to reliably process the wireless signal being received, each schedule defines which of the gain blocks are reduced in which order. For the SNR schedule 228, LNA1 is reduced first, which is followed by PGA, which is then followed by ATTN, and which is finally followed by LNA2. For the DIS schedule 230, LNA1 is reduced first, which is followed by ATTN, which is then followed by PGA, and which is finally followed by LNA2. The schedules appear to be similar except that the PGA and ATTN gain blocks are reversed in gain back-off order. As further described below, the difference between the schedules results in a significant difference in performance depending upon the communication conditions of the local network 100.

A first test was performed to determine the required power level in dBm of a Zigbee signal received at the antenna 202 of the Zigbee receiver 200 in order to obtain a 1% packet error rate (PER) versus the Zigbee channels (11-26) for different average power levels in dBm of a Wi-Fi blocker signal being transmitted by the WF wireless transceiver 104 when the SNR schedule 228 was selected. The Wi-Fi blocker signal was 100% 802.11n MCS3/20 MHz on Wi-Fi channel 1 (at frequency fc=2412 MHz). The average power level of the transmitted Wi-Fi signal ranged from −100 dBm to 0 dBm in 10 dB increments including when the transmitter of the WF wireless transceiver 104 was OFF (i.e., not transmitting). For the first four Zigbee channels 11-14, the required power level of the received Zigbee signal was about 7 dB to 8 dB less than the average power level of the transmitted Wi-Fi signal (e.g., when the transmitted Wi-Fi signal had an average power level −20 dBm, the required power level of the received Zigbee signal was about −27 dBm for Zigbee channels 11-14). For the remaining Zigbee channels 15-26, the required power level of the received Zigbee signal was reduced somewhat for each of the remaining channels, but was still significantly high for the higher Wi-Fi blocker levels. The required power level of the received Zigbee signal was about −100 dBm for the higher Zigbee channels when the average power level of the transmitted Wi-Fi signal was up to about −50 dBm.

As the average power level of the transmitted Wi-Fi signal was increased above −50 dBm, however, the required power level of the received Zigbee signal increased readily to the extent that Zigbee signals transmitted by remote Zigbee devices might not be detected. For example, when the average power level of the transmitted Wi-Fi signal was about −20 dBm, the required power level of the received Zigbee signal had to be at least about −60 dBm for Zigbee channels 15 and 16, at least −70 dBm to −80 dBm for Zigbee channels 17-22, and slightly greater than −60 dBm for channel 23.

A second test was performed similar to the first test, except that the DIS schedule 230 was selected instead of the SNR schedule 228. When the DIS schedule 230 was selected while the same Wi-Fi blocker signal was being transmitted and otherwise under the same conditions, the required power level of the received Zigbee signal was substantially lower for the higher channels 15-26. Even when the transmitted Wi-Fi signal had an average power of 0 dBm, the required power level of the received Zigbee signal was about −50 dBm for channel 15 and below −60 dBm for the remaining channels 16-26. In addition, when the transmitted Wi-Fi signal had an average power of −20 dBm, the required power level of the received Zigbee signal was about −68 dBm for channel 15 and below −80 dBm for the remaining channels 16-26.

A comparison of the two tests revealed that the selection of the AGC schedule has a substantial impact on the ability of the Z wireless transceiver 106 to receive Zigbee signals in the local network 100 while the WF wireless transceiver 104 is transmitting. The DIS schedule 230 is not optimal, however, for SNR at all gain levels and can result in degraded performance when no blocker signals exist or in the presence of moderate non-distorting blocker signals, such as continuous wave (CW) signals, Bluetooth signals (including low energy Bluetooth signals or BLE), other Zigbee signals, etc. In other words, the SNR schedule 228 achieves the best performance under most conditions except when the co-located wireless device, such as the WF wireless transceiver 104, is transmitting a distorting blocker signal. When the WF wireless transceiver 104 is transmitting a distorting blocker signal, the DIS schedule 230 achieves better performance.

Figure 5:
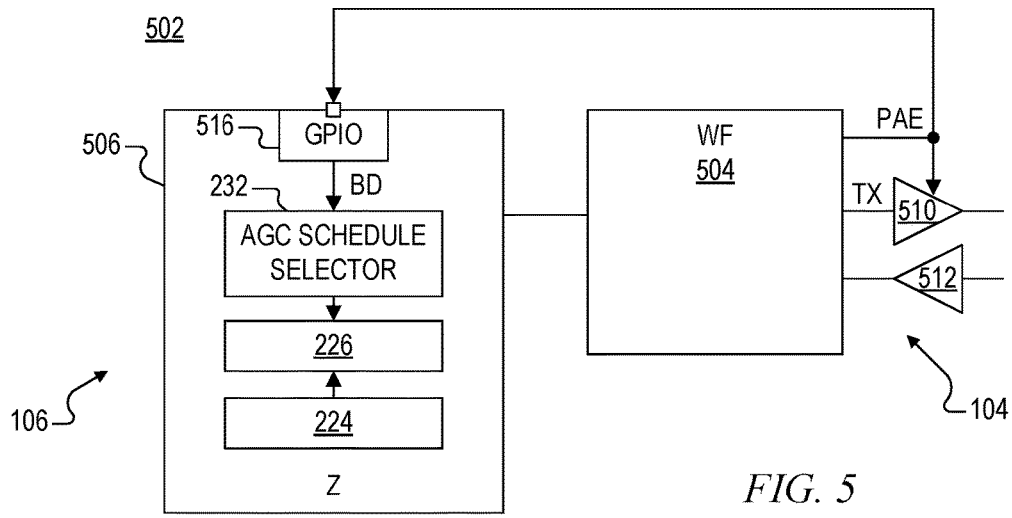
FIG. 5 is a block diagram of a gateway implemented according to one embodiment including the Z wireless transceiver of FIG. 1 with a Zigbee controller including hardware AGC schedule selection, in which the gateway may be used as the gateway of FIG. 1.

FIG. 5 is a block diagram of a gateway 502 implemented according to one embodiment including the Z wireless transceiver 106 with a Zigbee controller 506 including hardware AGC schedule selection, in which the gateway 502 may be used as the gateway 102 of FIG. 1. The gateway 502 includes the WF wireless transceiver 104 with a Wi-Fi controller 504 and other supporting circuitry, such as a power amplifier 510 for transmitting wireless signals and another gain amplifier 512 representing a receive chain for amplifying received wireless signals. The Wi-Fi controller 504 provides a TX signal to the input of the power amplifier 510 and asserts a power amplifier enable (PAE) signal to activate the power amplifier 510 for wireless transmission of the TX signal as a Wi-Fi signal. Although not shown or described, the gain amplifier 512 may be controlled using an automatic gain control method when receiving Wi-Fi signals.

The Zigbee controller 506 includes other supporting circuitry such as, for example, certain components of the Zigbee receiver 200 previously described. As shown, the Zigbee controller 506 includes or incorporates the AGC controller 224, the AGC schedule memory system 226, and the AGC schedule selector 232, and may further include a general purpose input/output (GPIO) port 516. It is noted that although the AGC schedule memory system 226 is shown provided on the Zigbee controller 506, the actual memory storing the AGC schedules may be located and accessed externally. In one embodiment, the Zigbee controller 506 is implemented as a semiconductor chip or integrated circuit (IC) in which the GPIO port 516 includes at least one input/output (I/O) pin for receiving or otherwise providing external signals. The PAE signal from the Wi-Fi controller 504 is provided to a pin of the GPIO port 516, which internally conveys the PAE signal as the BD select signal provided to the AGC schedule selector 232. When asserted, the BD signal instructs the AGC schedule selector 232 to switch from the SNR schedule 228 to the DIS schedule 230 of the AGC schedule memory system 226. In this manner, when the PAE signal is asserted by the Wi-Fi controller 504 to activate the power amplifier 510 to transmit a Wi-Fi signal, the PAE signal is conveyed to the Zigbee controller 506 which internally asserts the BD signal coincident therewith. In this case, the pin of the GPIO port 516 is effectively hardwired to the schedule select input of the AGC schedule selector 232, so that the BD signal is provided directly to indicate immediate selection of the DIS schedule 230 to improve receiver performance during transmission of the Wi-Fi signal. The SNR schedule 228 is selected whenever the BD signal is negated low.

It is noted that the switching between the different AGC schedules is not desired when the Z wireless transceiver 106 is actively receiving a wireless signal since a sudden gain transition may disrupt reception. Thus, the BD signal may be ignored while the Z wireless transceiver 106 is actively receiving a wireless signal.

Figure 6:
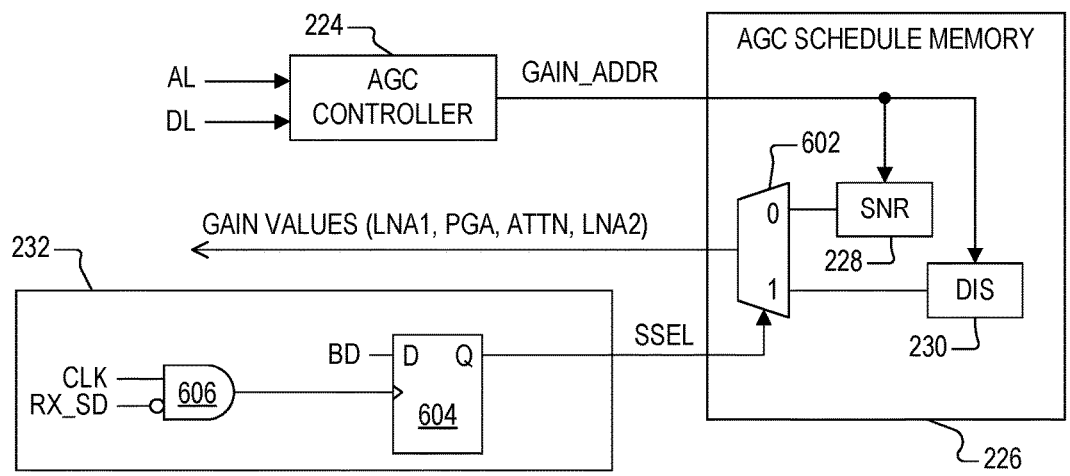
FIG. 6 is a more detailed block diagram of the AGC schedule selector of FIG. 2 implemented according to one embodiment coupled to the AGC schedule memory and the AGC controller of FIG. 2.

FIG. 6 is a more detailed block diagram of the AGC schedule selector 232 implemented according to one embodiment coupled to the AGC schedule memory system 226, which is further coupled to the AGC controller 224. The AGC controller 224 receives the AL and DL values and generates a corresponding gain address value GAIN_ADDR provided to respective address inputs of each of the AGC schedules 228 (SNR) and 230 (DIS). The SNR schedule 228 outputs a set of gain values and the DIS schedule 230 outputs another set of gain values associated with the provided gain address value GAIN_ADDR. In one embodiment, for example, the AGC schedules 228 and 230 may each be configured as a lookup table or the like that stores multiple gain values (LNA1, PGA, ATTN, LNA2) for each gain value indicated by GAIN_ADDR. The AGC schedule memory system 226 is shown including a set of multiplexers (MUX set) 602 having a set of zero (0) inputs receiving the output values from the SNR schedule 228 and a set of one (1) inputs receiving the output values from the DIS schedule 230. The MUX set 602 includes a select input receiving the schedule select signal SSEL from the Q output of a D-type flip-flop (DDF) 604. The AGC schedule selector 232 includes the DDF 604 and a 2-input logic AND gate 606. The BD signal is provided to the D input of the DDF 604, and the RX_SD signal indicating whether a wireless signal is being received is provided to the inverting input of the AND gate 606, having a non-inverting input receiving a clock signal CLK.

In operation, while the Z wireless transceiver 106 is not actively receiving a signal, the RX_SD is negated low so that the CLK signal passes to the clock input of the DFF 604. Thus, while RX_SD is low, the state of the SSEL signal follows the state of the BD signal with each operative level or edge of the CLK signal. When RX_SD and PAE are both negated low, BD is negated low to clock SSEL low to select the output of the SNR schedule 228 as the default condition while a Wi-Fi signal is not being transmitted. In this manner, the SNR schedule 228 is selected for optimal performance to detect Z wireless signals from Z devices in the local network 100. If RX_SD then goes high indicating that a Z wireless signal is being received while BD is still low, the AND gate 606 blocks the CLK signal from changing SSEL so that the SNR schedule 228 remains selected during reception of the Z wireless signal. The RX_SD signal remains high until the Z wireless signal is completed, so that even if the PAE signal is asserted high by the WF wireless transceiver 104 causing the BD signal to also go high, the SSEL signal remains unchanged to avoid switching AGC schedules during reception.

If instead the PAE signal and then the BD signal are both asserted high while RX_SD is low, then the SSEL signal is almost immediately clocked high to select the output of DIS schedule 230. While the PAE and BD signals remain asserted high and the RX_SD signal remains low, SSEL remains asserted high to continue selecting the DIS schedule 230. If the RX_SD signal goes high while the BD and SSEL signals are both high, then SSEL remains high even though CLK is blocked to achieve optimal performance of the Z wireless transceiver 106 for receiving a Z wireless signal while the WF wireless transceiver 104 is transmitting a Wi-Fi signal. If the PAE and BD signals both go low while RX_SD is still asserted high, then SSEL remains asserted high during the remaining portion of the Z wireless signal to prevent switching of the AGC schedule during active reception of the Z wireless signal.

Figure 7:
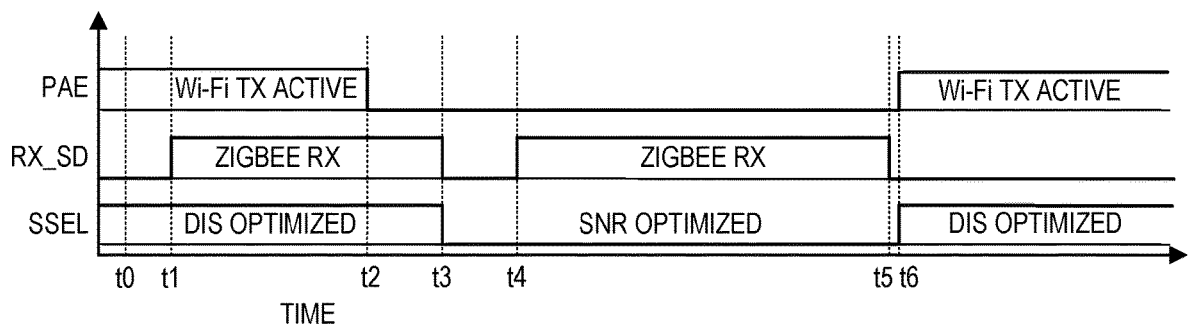
FIG. 7 is a timing diagram illustrating operation of the AGC schedule selector of FIG. 2 for selecting one of the AGC schedules during operation according to one embodiment.

FIG. 7 is a timing diagram illustrating operation of the AGC schedule selector 232 for selecting one of the AGC schedules 228 and 230 during operation according to one embodiment. The PAE, RX_SD and SSEL signals are plotted versus time. At an initial time t0, PAE is high indicating that the WF wireless transceiver 104 is actively transmitting a Wi-Fi signal while SSEL is also asserted high to select the DIS schedule 230. In this manner, the PAE signal was asserted high when the RX_SD signal was low so that SSEL was clocked high to select the DIS schedule 230 while the Wi-Fi signal is being transmitted. At subsequent time t1, the Z wireless transceiver 106 detects a Z wireless signal and asserts RX_SD high. Since CLK is blocked, SSEL remains asserted high to continue selecting DIS schedule 230 during the remaining portion of transmission of the Wi-Fi signal. In this manner, the Zigbee controller 506 of the Z wireless transceiver 106 is configured for optimal performance for receiving the Z wireless signal during Wi-Fi transmission.

At subsequent time t2, the WF wireless transceiver 104 completes transmission of the Wi-Fi signal and negates the PAE signal. Although the BD signal is also negated low in response, the Zigbee controller 506 is still actively receiving the Z wireless signal so that RX_SD remains asserted blocking CLK from clocking the DFF 604. Thus, the DIS schedule 230 remains selected for the remainder of the Z wireless signal up to a subsequent time t3 to prevent the AGC schedule from being switched during reception. At time t3 when the Z wireless signal is completed, the Zigbee controller 506 negates RX_SD low while BD is still low, so that the SSEL signal is negated low to select the SNR schedule 228. In this manner, the Zigbee controller 506 of the Z wireless transceiver 106 is configured for optimal performance for receiving Z wireless signals while the WF wireless transceiver 104 is not transmitting a Wi-Fi signal.

At subsequent time t4, the Zigbee controller 506 of the Z wireless transceiver 106 detects a Z wireless signal and asserts RX_SD high. The CLK signal is blocked so that SSEL remains low to select the SNR schedule 228 while the Z wireless signal is being received. In this manner, the Zigbee controller 506 of the Z wireless transceiver 106 is configured for optimal performance for receiving the Z wireless signal. The Z wireless signal completes at a subsequent time t5. Although not shown, if the Wi-Fi controller 504 of the WF wireless transceiver 104 asserted the PAE signal between times t4 and t5 to transmit a Wi-Fi signal while the Z wireless signal is still being received, the CLK signal would be blocked to keep SSEL low to prevent AGC schedule switching.

At subsequent time t5, the Z wireless signal is completed so that RX_SD is negated low. At time t5, the PAE and BD signals are still low so that SSEL remains low. At a subsequent time t6 almost immediately after time t5, the Wi-Fi controller 504 of the WF wireless transceiver 104 asserts the PAE signal to transmit another Wi-Fi signal. Since RX_SD is negated low, CLK is passed and SSEL is clocked high to once again select the DIS schedule 230 during transmission of the Wi-Fi signal. In this manner, the Zigbee controller 506 of the Z wireless transceiver 106 is once again configured for optimal performance for receiving any Z wireless signals during Wi-Fi transmission.

Figure 8:
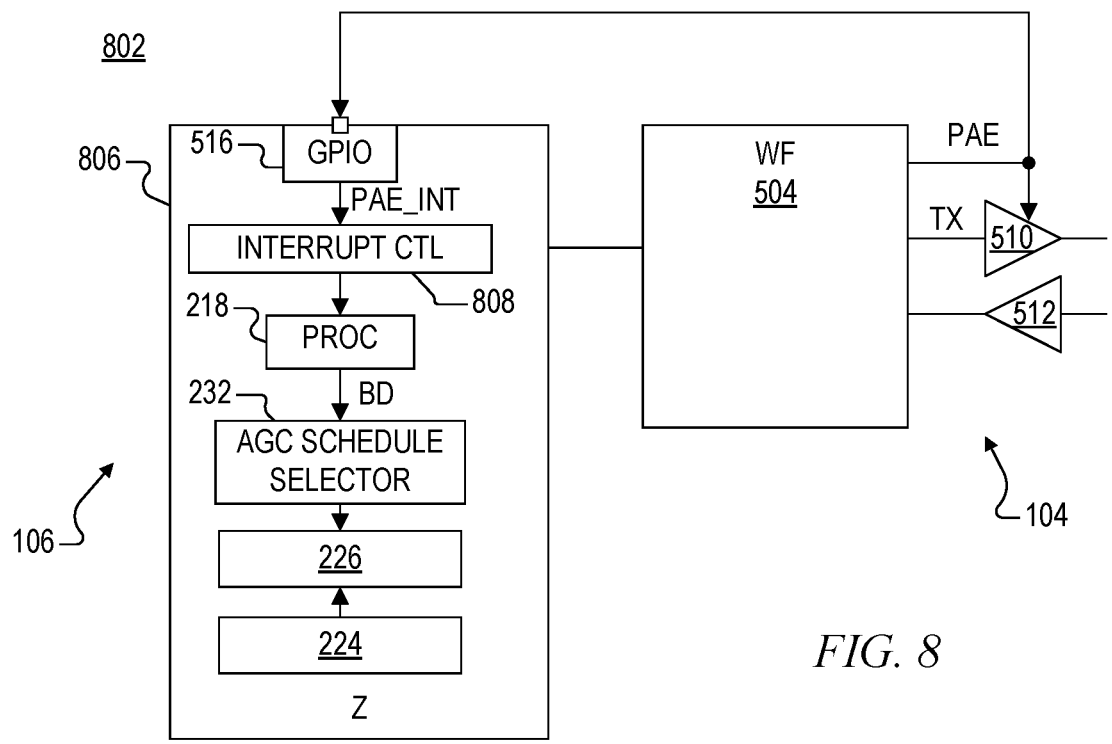
FIG. 8 is a block diagram of a gateway implemented according to another embodiment including the Z wireless transceiver of FIG. 1 with a Zigbee controller with AGC schedule selection based on interrupt control, in which the gateway may instead be used as the gateway of FIG. 1.

FIG. 8 is a block diagram of a gateway 802 implemented according to another embodiment including the Z wireless transceiver 106 with a Zigbee controller 806 with AGC schedule selection based on interrupt control, in which the gateway 802 may instead be used as the gateway 102 of FIG. 1. The gateway 802 includes the WF wireless transceiver 104 with the Wi-Fi controller 504 and other supporting circuitry, such as the power amplifier 510 and the gain amplifier 512 in a similar manner as described for the gateway 502. As previously described, the Wi-Fi controller 504 provides a TX signal to the input of the power amplifier 510 and asserts the PAE signal to activate the power amplifier 510 for wireless transmission of the TX signal as a Wi-Fi signal.

The Zigbee controller 806 includes other supporting circuitry such as, for example, certain components of the Zigbee receiver 200 previously described. As shown, the Zigbee controller 806 further includes or incorporates the AGC schedule selector 232, the GPIO port 516, the digital processing circuitry 218, and an interrupt controller (CTL) 808. It is noted that although the AGC schedule memory system 226 is shown provided on the Zigbee controller 806, the actual memory storing the AGC schedules may be located and accessed externally. In one embodiment, the Zigbee controller 806 is implemented as a semiconductor chip or IC in which the GPIO port 516 includes at least one I/O pin the PAE signal from the Wi-Fi controller 504. In this case, rather than providing the PAE signal internally as the BD signal directly to the AGC schedule selector 232, the PAE signal is internally conveyed as an interrupt signal PAE_INT to the interrupt controller 808. The digital processing circuitry 218 may include a processor or the like that executes an interrupt handler in response to assertion of the interrupt signal PAE_INT. The interrupt handler, when executed by the digital processing circuitry 218 in response to the PAE_INT sensed by the interrupt controller 808, asserts the BD signal to the AGC schedule selector 232.

Although not specifically shown, the digital processing circuitry 218 may include register or memory location or the like including an BD bit used to develop the BD signal. Operation of the AGC schedule selector 232 may be similar to that previously shown and described for FIG. 6.

Operation of the Zigbee controller 806 of the gateway 802 is similar to the Zigbee controller 506, except that BD signal is not generated directly by the GPIO 516 in response to the PAE signal but is instead relayed through the interrupt controller 808 and the digital processing circuitry 218 in the form of an interrupt. Operation is similar, except that the interrupt process and the interrupt handler may incur latency as compared to the direct hardware approach used by the Zigbee controller 506. The PAE interrupt may be given a very high priority, yet the digital processing circuitry 218 may complete or otherwise save its current task and jump to the interrupt handler routine, which in turn controls the BD signal accordingly. The interrupt controller 808 may also detect when PAE is subsequently negated to generate another interrupt to negate BD to switch back to the SNR schedule 228.

Figure 9:
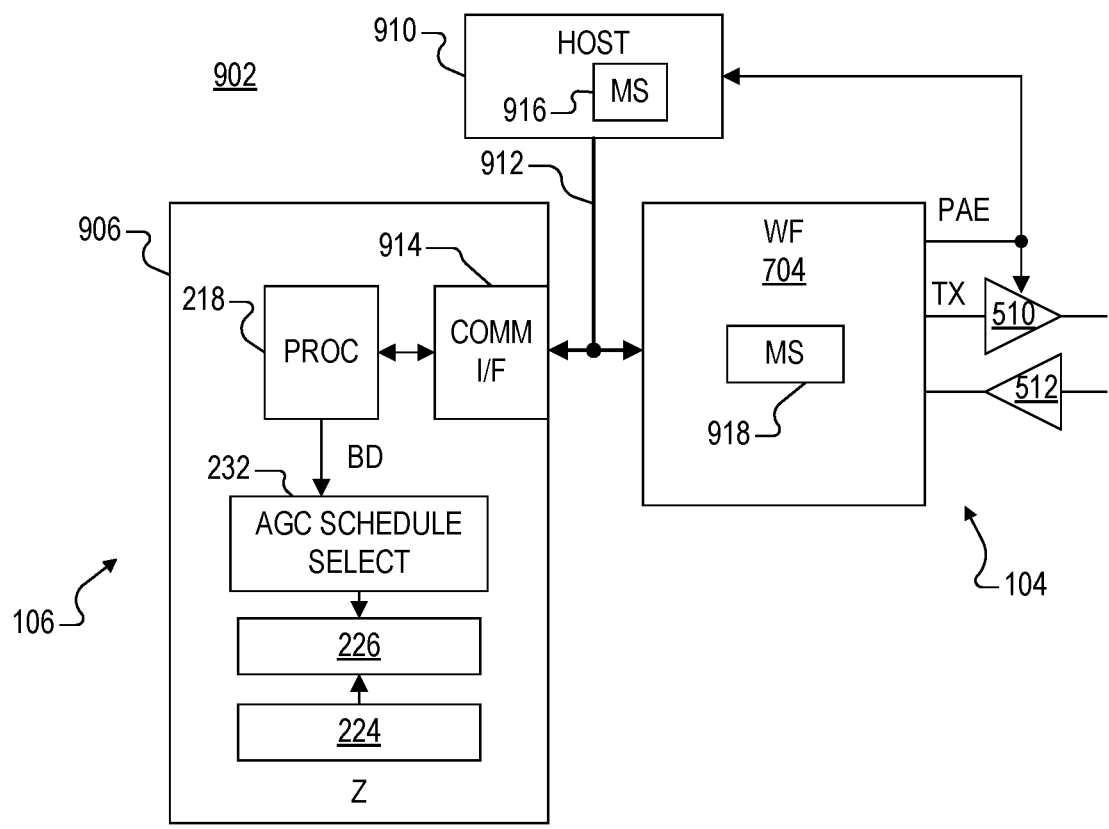
FIG. 9 is a block diagram of a gateway implemented according to another embodiment including the Z wireless transceiver of FIG. 1 with a Zigbee controller with AGC schedule selection based on software control, in which the gateway may instead be used as the gateway of FIG. 1.

FIG. 9 is a block diagram of a gateway 902 implemented according to another embodiment including the Z wireless transceiver 106 with a Zigbee controller 906 with AGC schedule selection based on software control, in which the gateway 902 may instead be used as the gateway 102 of FIG. 1. The gateway 902 includes the WF wireless transceiver 104 with the Wi-Fi controller 504 and other supporting circuitry, such as the power amplifier 510 the gain amplifier 512 in a similar manner as previously described for the gateway 502. The Wi-Fi controller 504 provides a TX signal to the input of the power amplifier 510 and asserts the PAE signal to activate the power amplifier 510 for wireless transmission of the TX signal as a Wi-Fi signal. In this case the PAE signal may not be provided to the Zigbee controller 906 but may be provided to a host device 910. The Wi-Fi controller 504, the Zigbee controller 906, and the host device 910 may communicate to each other through a communication channel 912.

The Zigbee controller 906 may include the digital processing circuitry 218 and the AGC schedule selector 232 in a similar manner as previously described, and may further include a communication interface (I/F) 914 internally coupled to the digital processing circuitry 218 for enabling communication with the host device 910 and/or the Wi-Fi controller 504 via the communication channel 912. It is noted that although the AGC schedule memory system 226 is shown provided on the Zigbee controller 906, the actual memory storing the AGC schedules may be located and accessed externally. The communication channel 912 may be implemented according to any one or more different configurations, such as a Universal Serial Bus (USB), a serial peripheral interface (SPI), a secure digital input output (SDIO), or any other suitable communication platform between devices.

The digital processing circuitry 218 may include a processor or the like that executes code in the form of firmware or software for controlling the state of the BD signal. In one embodiment, the default configuration is to hold BD low to select the SNR schedule 228 for receive operations. The host device 910 may also include a processor or other processing circuitry that executes code for controlling operations of the gateway 902. The host code may include mode select (MS) code 916 or the like, which may issue software commands or the like via the communication channel 912 to the Zigbee controller 906 for selecting between the SNR schedule 228 and the DIS schedule 230. In addition or in the alternative, the Wi-Fi controller 504 may include mode select (MS) code 918 or the like, which may issue software commands via the communication channel 912 to the Zigbee controller 906 for selecting between the SNR schedule 228 and the DIS schedule 230.

The configuration of the Zigbee controller 906 avoids the use of a GPIO input and provides software control over selection of the AGC schedule. Such software control may incur additional latency as compared to a hardware configuration (e.g., the Zigbee controller 506 of FIG. 5) or even an interrupt configuration (e.g., the Zigbee controller 806 of FIG. 8). The Zigbee controllers 506 and 806 provide a more direct means of detecting or otherwise indicating that a strong blocking Wi-Fi signal is being generated by the Wi-Fi controller 504. The Zigbee controller 906 that selects the AGC schedule using software control provides a means of determining when a strong blocking Wi-Fi signal is "expected" to be present. For example, the software may be programmed to switch to the DIS schedule 230 during time periods when the Wi-Fi controller 504 is expected to be highly active, or may even be programmed to use the DIS schedule 230 as the default configuration if it is known that the WF wireless transceiver 104 will be active most of the time (such as, e.g., when Wi-Fi communications are expected to be heavy most of the time in the local network 100).

The Zigbee controller may be preconfigured into any one of the various configurations, such as for hardware control (e.g., the Zigbee controller 506), for interrupt control (e.g., the Zigbee controller 806), or for software control (e.g., the Zigbee controller 906). In an alternative embodiment, the Zigbee controller may be programmable and programmed using an application programming interface (API) or the like into any one of the various configurations. For example, the API may be used to convey a GPIO pin as a hardwire signal directly to the AGC schedule selector 232 for hardware control. Alternatively, the API may be used to convey a GPIO pin as an interrupt signal to the interrupt controller 908 including defining an interrupt handler to control the BD signal accordingly. Alternatively, the API may be used to program the digital processing circuitry 218 to recognize commands from external devices via the communication I/F 914 for controlling the BD signal accordingly.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A wireless receiver, comprising:
   a plurality of amplifiers coupled in series for amplifying a signal being received;
   at least one detector that provides a strength indication of said signal being received;
   a plurality of automatic gain control (AGC) schedules, each determining a gain reduction schedule for said plurality of amplifiers, wherein said plurality of AGC schedules includes a first AGC schedule configured for improved signal-to-noise ratio performance and a second AGC schedule configured for improved distortion performance;

an AGC schedule selector that selects one of said plurality of AGC schedules based on a schedule select input; and an AGC controller that adjusts a gain of at least one of said plurality of amplifiers according to a selected one of said plurality of AGC schedules based on said strength indication of said signal being received.

2. The wireless receiver of claim 1, wherein said schedule select input selects said second AGC schedule when a strong distorting blocker signal is detected and otherwise selects said first AGC schedule.

3. The wireless receiver of claim 1, wherein said schedule select input selects said second AGC schedule when a strong distorting blocker signal is expected and otherwise selects said first AGC schedule.

4. The wireless receiver of claim 1, wherein:
said plurality of amplifiers comprises an input attenuator, a low noise amplifier, and a programmable gain amplifier;
wherein said first AGC schedule reduces gain in the order of a first input of said low noise amplifier, then said programmable gain amplifier, then said attenuator, and then a second input of said low noise amplifier; and
wherein said second AGC schedule reduces gain in the order of said first input of said low noise amplifier, then said attenuator, then said programmable gain amplifier, and then said second input of said low noise amplifier.

5. The wireless receiver of claim 1, wherein said AGC schedule selector prevents a change between said plurality of AGC schedules while a receive detect signal indicates that a wireless signal is being received.

6. The wireless receiver of claim 1, wherein said AGC schedule selector is implemented on an integrated circuit having an input pin, and wherein said schedule select input is hardwired to said input pin.

7. The wireless receiver of claim 1, wherein:
said AGC schedule selector is implemented on an integrated circuit having an input pin; and
further comprising a processing circuit including an interrupt circuit implemented on said integrated circuit and coupled to said input pin that causes said processing circuit to control said schedule select input based on a signal received via said input pin.

8. The wireless receiver of claim 1, wherein:
said AGC schedule selector is implemented on an integrated circuit;
a communication interface implemented on said integrated circuit for interfacing external devices; and
a processing circuit implemented on said integrated circuit and coupled to said communication interface and said schedule select input of said AGC schedule selector, wherein said processing circuit controls selection of one of said plurality of AGC schedules based on a mode command received via said communication interface.

9. A wireless communication system, comprising:
a first wireless transceiver and a second wireless transceiver that are co-located in the same device;
wherein said second wireless transceiver is capable of generating a strong blocker signal when transmitting; and
wherein said first wireless transceiver comprises:
a plurality of automatic gain control (AGC) schedules including a first AGC schedule configured for improved signal-to-noise ratio performance and a second AGC schedule configured for improved distortion performance;

an AGC schedule selector that selects one of said plurality of AGC schedules based on a blocker indication specifying when said second wireless transceiver is transmitting; and an AGC controller that adjusts a gain of said first wireless transceiver according to a selected one of said plurality of AGC schedules while receiving a signal.

10. The wireless communication system of claim 9, wherein said AGC schedule selector selects said second AGC schedule when said blocker indication indicates that said second wireless transceiver is transmitting and otherwise selects said first AGC schedule.

11. The wireless communication system of claim 9, wherein said first wireless transceiver is configured according to a Zigbee protocol and wherein said second wireless transceiver is configured according to a Wi-Fi protocol.

12. The wireless communication system of claim 9, wherein said AGC schedule selector prevents changing between said plurality of AGC schedules while a receive active signal indicates that said first wireless transceiver is actively receiving a signal.

13. The wireless communication system of claim 9, wherein said first wireless transceiver further comprises:
a receiver circuit comprising an input attenuator, a low noise amplifier, and a programmable gain amplifier;
wherein said first AGC schedule adjusts gain in the order of a first input of said low noise amplifier, then said programmable gain amplifier, then said attenuator, and then a second input of said low noise amplifier; and
wherein said second AGC schedule adjusts gain in the order of said first input of said low noise amplifier, then said attenuator, then said programmable gain amplifier, and then said second input of said low noise amplifier.

14. The wireless communication system of claim 9, wherein:
said second wireless transceiver asserts a power amplifier enable signal to indicate when transmitting; and
wherein said first wireless transceiver includes a controller having an input port receiving said power amplifier enable signal as said blocker indication, and wherein said input port is hardwired to a select input of said AGC schedule selector for selecting from among said plurality of AGC schedules.

15. The wireless communication system of claim 9, wherein:
said second wireless transceiver asserts a power amplifier enable signal to indicate when transmitting; and
wherein said first wireless transceiver comprises a controller which further comprises:
an input port receiving said power amplifier enable signal;
an interrupt controller coupled to said input port and configured to generate an interrupt when said power amplifier enable signal changes state; and
a processing circuit that detects said interrupt and that provides said blocker indication to a select input of said AGC schedule selector for selecting from among said plurality of AGC schedules.

16. The wireless communication system of claim 9, wherein said first wireless transceiver comprises a controller which further comprises:
a communication interface; and a processing circuit coupled to said communication interface and said AGC schedule selector that generates said blocker indication based on a mode command received via said communication interface.

17. A method of automatic gain control (AGC) of a wireless receiver, comprising:
providing a plurality of AGC schedules available to the wireless receiver including a first AGC schedule configured for improved signal-to-noise ratio performance and a second AGC schedule configured for improved distortion performance;
receiving an AGC schedule selection indication from an external device;
selecting, based on the AGC schedule selection indication, one of a plurality of AGC schedules; and
adjusting gain while receiving a wireless signal according to a selected one of the plurality of AGC schedules.

18. The method of claim 17, wherein:
said receiving an AGC schedule selection indication comprises receiving a transmit indication from a co-located device when transmitting a blocking signal; and
wherein said selecting comprises selecting the second AGC schedule while the transmit indication is provided.

19. The method of claim 17, wherein:
said receiving an AGC schedule selection indication comprises receiving a selection command via a communication interface; and
wherein said selecting comprises selecting one of the plurality of AGC schedules based on the selection command.

* * * * *